United States Patent
Chen et al.

(10) Patent No.: US 7,635,620 B2
(45) Date of Patent: Dec. 22, 2009

(54) SEMICONDUCTOR DEVICE STRUCTURE HAVING ENHANCED PERFORMANCE FET DEVICE

(75) Inventors: Xiangdong Chen, Poughquag, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 11/306,745

(22) Filed: Jan. 10, 2006

(65) Prior Publication Data

US 2008/0217665 A1 Sep. 11, 2008

(51) Int. Cl.
*H01L 21/8238* (2006.01)
(52) U.S. Cl. ............... 438/199; 257/288; 257/E27.108
(58) Field of Classification Search ................... 438/199
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,268,330 A * | 12/1993 | Givens et al. ............... 438/586 |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |

(Continued)

FOREIGN PATENT DOCUMENTS

JP 64-76755 3/1989

OTHER PUBLICATIONS

F. Ootsuka, et al., "A Highly Dense, High-Performance 130nm node CMOS Technology for Large Scale System-on-a-Chip Applications", IEDM, pp. 23.5.1-23.5.4, 2000.

(Continued)

*Primary Examiner*—Thao X Le
*Assistant Examiner*—Kimberly Trice
(74) *Attorney, Agent, or Firm*—Scully, Scott, Murphy & Presser, P.C.; Joseph P. Abate, Esq.

(57) ABSTRACT

A method for making a semiconductor device structure, includes: providing a substrate; forming on the substrate: a first layer below and second layers on a gate with spacers, source and drain regions adjacent to the gate, silicides on the gate and source and drain regions; disposing a stress layer over the structure resulting from the forming step; disposing an insulating layer over the stress layer; removing portions of the insulating layer to expose a top surface of the stress layer; removing the top surface and other portions of the stress layer and portions of the spacers to form a trench, and then disposing a suitable stress material into the trench.

14 Claims, 6 Drawing Sheets

U.S. PATENT DOCUMENTS

| | | | |
|---|---|---|---|
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 6,717,216 B1 | 4/2004 | Doris et al. | |
| 6,806,584 B2 | 10/2004 | Fung et al. | |
| 6,831,292 B2 | 12/2004 | Currie et al. | |
| 6,869,866 B1 | 3/2005 | Chidambarrao et al. | |
| 6,890,808 B2 | 5/2005 | Chidambarrao et al. | |
| 6,930,030 B2 | 8/2005 | Rausch et al. | |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2006/0246641 A1 * | 11/2006 | Kammler et al. | 438/184 |

OTHER PUBLICATIONS

Kern Rim, et al., "Transconductance Enhancement in Deep Submicron Strained-Si n-MOSFETs". International Electron Devices Meeting, 26, 8, 1, IEEE, Sep. 1998.

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeing, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and Its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al, "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBT's Following Radiation and Hot-Carrier Stressing," pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, at al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x Gex Strained Layers on (100) Si". Appl. Phys. Lett. 56 (5), Jan. 29, 1990, pp. 460-462.

* cited by examiner

ILD CMP/RIE BACK TO EXPOSE TOP SURFACE OF Si$^3$N$^4$

Si³N⁴ ETCH SELECTIVELY TO OXIDE

COMPRESSIVE Si³N⁴ DEPOSITION

US 7,635,620 B2

SEMICONDUCTOR DEVICE STRUCTURE HAVING ENHANCED PERFORMANCE FET DEVICE

FIELD OF THE INVENTION

The present invention relates to methods for making Metal Oxide Semiconductor (MOS) device structures and, more particularly, for using layers/films to affect channel stresses and performances of MOS Field Effect Transistors (e.g. nFETs, pFETs), and to the resulting device structures.

BACKGROUND OF THE INVENTION

MOSFETs and various methods of their manufacture are well known. Typically, a MOSFET includes source and drain regions at a surface formed in or on a suitable substrate, and a gate disposed therebetween. Silicide electrical layers or contacts are formed on the gate, and on the source and drain regions. In general, the typical known silicidation process is as follows: source and drain implants are done followed by a metal deposition and then an anneal to react the metal and implanted or doped silicon to form the silicide. Substrates include, for example, bulk semiconductor (e.g. silicon), silicon-on-insulator substrates (SOI), among other substrates. See, for example, U.S. Pat. No. 6,930,030 B2, METHOD OF FORMING AN ELECTRONIC DEVICE ON A RECESS IN THE SURFACE OF THIN FILM OF SILICON ETCHED TO A PRECISE THICKNESS, issued Aug. 16, 2005, by Rausch et al. which is hereby incorporated in its entirety by reference. FIG. 2M of the '030 patent, partially reproduced as FIG. 10 herein, shows a silicide layer/contact 54 disposed on a top surface of a polysilicon gate 44 of an nFET device 20 formed in an SOI substrate. Also shown are an oxide layer 42 disposed below the gate and spacers 48 disposed at sidewalls of the gate, and oxide layers 46 disposed between the spacers 48 and the gate 44.

In CMOS technologies, nFET and pFET devices are optimized to achieve a required CMOS performance. Very different dopant species are used for nFET devices and pFET devices, accordingly. These species have very different physical properties such as a diffusion rate and a maximum activated concentration. In conventional CMOS technologies, both the nFET and the pFET usually share the same spacer process and topology. In order to optimize CMOS performance, the spacers typically can be of one maximum width and are designed to trade-off the performance between the nFET and the pFET. For example, if Arsenic and Boron are used as the source and drain dopants for the nFET and the pFET, respectively, it is known that a narrower spacer is better for the nFET but a much wider one is better for the pFET, because Arsenic diffuses much slower than Boron. In this case, the pFET is a limiting factor. Thus, the maximum width of all spacers is optimized for the pFET, trading-off the nFET performance.

It is also known to enhance the performances of n-type field effect transistor devices (nFETs) and p-type field effect transistor devices (pFETs) by providing tensile stresses to the channels of the nFETs and compressive stresses to the channels of the pFETs.

See, for example, U.S. Pat. No. 6,869,866 B1, SILICIDE PROXIMITY STRUCTURES FOR CMOS DEVICE PERFORMANCE IMPROVEMENTS, by Chidambarrao et al., filed Sep. 22, 2003, issued Mar. 22, 2005; U.S. Pat. No. 6,890,808 B2, METHOD AND STRUCTURE FOR IMPROVED MOSFETS USING POLY/SILICIDE GATE HEIGHT CONTROL, by Chidambarrao et al., filed Sep. 10, 2003, issued May 10, 2005; and U.S. Pat. No. 6,806,584 B2, SEMICONDUCTOR DEVICE STRUCTURE INCLUDING MULTIPLE FETS HAVING DIFFERENT SPACER WIDTHS, by Fung et al., filed Oct. 21, 2002, issued Oct. 19, 2004, which are all hereby incorporated herein in their entireties by reference.

However, the present inventors believe that the methods and resulting device structures according to the prior art can be improved further, to provide a performance-enhanced FET device.

SUMMARY OF THE INVENTION

It is a principal object of the present invention to provide a method for making an enhanced performance semiconductor device, which method is readily compatible with conventional processes for making semiconductor device structures.

It is another object of the present invention to provide a semiconductor device structure including an nFET device in which tensile stress in the channel is adjusted to enhance the mobility of the nFET device.

It is a further object of the present invention to provide a semiconductor device structure including a pFET device in which compressive stress in the channel is adjusted to enhance the mobility of the pFET device.

A method for making a semiconductor device structure comprises: providing a substrate; forming on the substrate: a first layer below and second layers on a gate with spacers, source and drain regions adjacent to the gate, silicides on the gate and source and drain regions; disposing a stress layer over the structure resulting from the forming step; disposing an insulating layer over the stress layer; removing portions of the insulating layer to expose a top surface of the stress layer; removing the top surface and other portions of the stress layer and portions of the spacers to form a trench; and then disposing a stress material into the trench.

For an nFET device structure, the stress layer is a tensile stress layer and the stress material disposed in the trench is a compressive stress material.

For a pFET device structure, the stress layer is a compressive stress layer and the stress material disposed in the trench is a tensile stress material.

Preferably, the insulating layer is an oxide; the stress layer is silicon nitride, an oxide or a silicide, and the stress material is silicon nitride, or other suitable stress material.

Also according to the present invention, a semiconductor device structure comprises: a field effect transistor device including a substrate, the transistor device being of an n conductive type and including a gate stack on the substrate; the gate stack being provided with sidewall layers and sidewall spacers; a stress film disposed on the field effect transistor device; the sidewall spacers and the stress film forming a trench into which a portion of the gate stack provided with sidewall layers extends, and a stress material disposed in the trench, so that a stress resulting in the channel of the field effect transistor is increased.

Further and still other objects of the present invention will become more readily apparent when the following detailed description is taken in conjunction with the following drawings, in which:

DETAILED DESCRIPTION OF THE PREFERRED EMBODIMENT

A preferred embodiment and best mode of the present invention will now be described with reference to FIGS. 1-8, for making a semiconductor device structure including an nFET. However, it is understood by those skilled in the art in view of the instant disclosure that Applicant's method is applicable for producing a semiconductor device structure including a pFET. See FIG. 9, for example.

Figure 1:
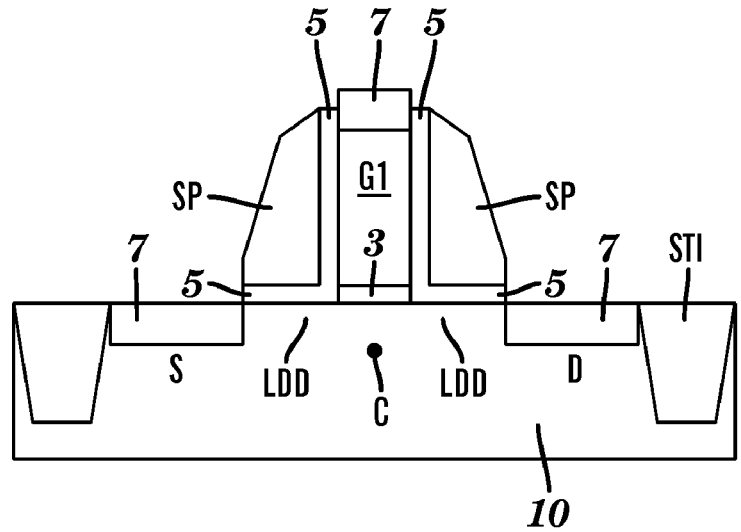
FIG. 1 through FIG. 7 are side-sectional schematic views of sequential semiconductor device structures resulting from the various sequential steps according to one preferred embodiment of the present invention, when used to make nFET semiconductor device structure including: an nFET device having a channel C; a trench 40 formed by portions of sidewall spacers SP1, tensile stress film 20, oxide layers 5, silicide layer 7; and a compressive stress material 30 disposed in the trench 40.

Firstly, with reference to FIG. 1, provide a substrate 10 which has formed thereon an oxide layer 3 disposed below a gate G1 provided with sidewall spacers SP, oxide layers 5 disposed between the gate G1 and the spacers SP and between the spacers SP and the substrate 10, suitably implanted source and drain regions S, D formed adjacent to the gate, an isolation region STI disposed in the substrate 10, and silicides 7 disposed on the gate, and source and drain regions S,D. Also shown are lightly doped source and drain regions LDD. The device of FIG. 1 is conventional and can correspond, for example, to the prior art SOI-nFET device shown in FIG. 8 (STI regions are not shown in FIG. 8).

The semiconductor substrate 10 is, for example, a bulk silicon (Si) substrate or a silicon-on-insulator (SOI) substrate. Alternatively, the substrate 10 is a hybrid substrate which includes more than one surface orientation. The substrate alternatively includes a semiconductor material other than Si, such as Ge or any combination of Group III-V elements or Group II-V elements.

After an initial substrate cleaning procedure (conventional), an isolation scheme is carried out. As is well known in semiconductor manufacturing, the isolation scheme is used to separate selected semiconductor devices electrically from each other. The isolation scheme is a standard or a modified shallow trench isolation (STI) scheme. An isolation region STI is shown in FIG. 1. Alternatively, the isolation is accomplished using a LOCOS process or mesa isolation scheme, as is well known in the art of fabricating semiconductor devices. For various known or conventional processes for fabricating semiconductor devices, see for example VLSI Technology, $2^{nd}$ Edition, by S. M. Sze, (McGraw Hill Publishing Co., 1988).

After the isolation region STI is formed, a conventional gate oxide pre-cleaning process is performed. As is the case in known high performance (e.g., logic) or low performance (e.g., memory or analog) fabrication processes, various conventional gate oxide processes may be used to fabricate devices having different gate oxide thicknesses. The gate oxide 3 is formed, for example, using a conventional thermal oxidation process. The gate oxide 3 is formed using $N_2O$, NO, $O_2$ or any combination of them. The oxide 3 may be nitridized using a conventional plasma process. Alternatively, the gate oxide 3 is formed using a base oxide followed by deposition of a high k gate dielectric material such as aluminum oxide, or hafnium oxide, or another high k gate dielectric. The gate dielectric material has, for example, one approximately (+10%) uniform thickness selected from a range of about (+10%) 0.6 nm to about 7 nm.

Next, the gate electrode or gate G1 is formed conventionally. Preferably, the gate G1 is formed from a polysilicon layer (not shown) deposited by a low pressure chemical vapor deposition (LPCVD) using a reactant gas such as silane ($SiH_4$). The thickness (height) of the layer is between about 1000 and 3000 Angstroms. The layer is then conductively doped n-type by ion implanting arsenic ($As^{75}$) or phosphorus ($P^{31}$). The final dopant concentration of the layer after implantations is preferred between about 1.0 E 18 and 1.0 E 21 atoms/cm$^3$. Conventional photolithographic techniques and conventional anisotropic plasma etching are used to pattern the polysilicon layer which includes forming the gate electrode G1 over the device areas. The device areas include a channel C. The polysilicon layer is plasma etched using a reactive ion etching (RIE) or a high density plasma (HDP) etching and an etchant gas such as chlorine ($Cl_2$).

After removing a photoresist mask (not shown), for example, by plasma etching in oxygen ($O_2$), lightly doped source and drain (LDD) or extension areas are formed in the device areas adjacent to the gate electrode by ion implantation, using a second conductive type dopant, such as As or P. Polysilicon sidewall reoxidation layers 5 or offset spacers could be used to offset the LDD implants. Typically, the LDD areas are doped to a concentration of between about 1.0 E 19 and 5.0 E 20 atoms/cm$^3$. Next, a conformal insulating layer (not shown) is deposited using conventional deposition techniques (e.g., CVD) and anisotropically plasma etched back to form sidewall spacers SP on the sidewalls of the gate electrode G1 and/or on oxide layers 5. FIG. 1 shows the spacers SP disposed on the oxide layers 5 formed on the gate G1 and on substrate 10. Typically, the insulating layer for forming the spacers SP is silicon oxide ($SiO_2$) and is deposited by a low pressure CVD (LPCVD) using tetraethosiloxane (TEOS) as the reactant gas, and is deposited to a preferred thickness of about (±10%) 200 Angstroms to about (±10%) 1000 Angstroms. Other options include nitride spacers or a combination of multiple spacers with nitride and oxide materials.

A conventional etch back is then carried out using a reactive ion etching (RIE) and an etchant gas such as carbon tetrafluoride ($CF_4$) and hydrogen $H_2$ or methylfluoride ($CHF_3$), which etches the $SiO_2$ layer selectively to the silicon substrate and polysilicon gate electrode. Heavily doped source and drain contact areas S,D are then formed in the device areas adjacent to the insulating sidewall spacers SP by ion implanting a second conductive type dopant, such as arsenic. The contact areas are doped to a final concentration of between about 1.0 E 18 and 1.0 E 21 atoms/cm$^3$. Any residual native oxide remaining on the source and drain contact areas and the exposed top surface of the polysilicon gate electrodes is removed, for example, using a dip etch in a dilute hydrofluoric acid solution.

Figure 10:
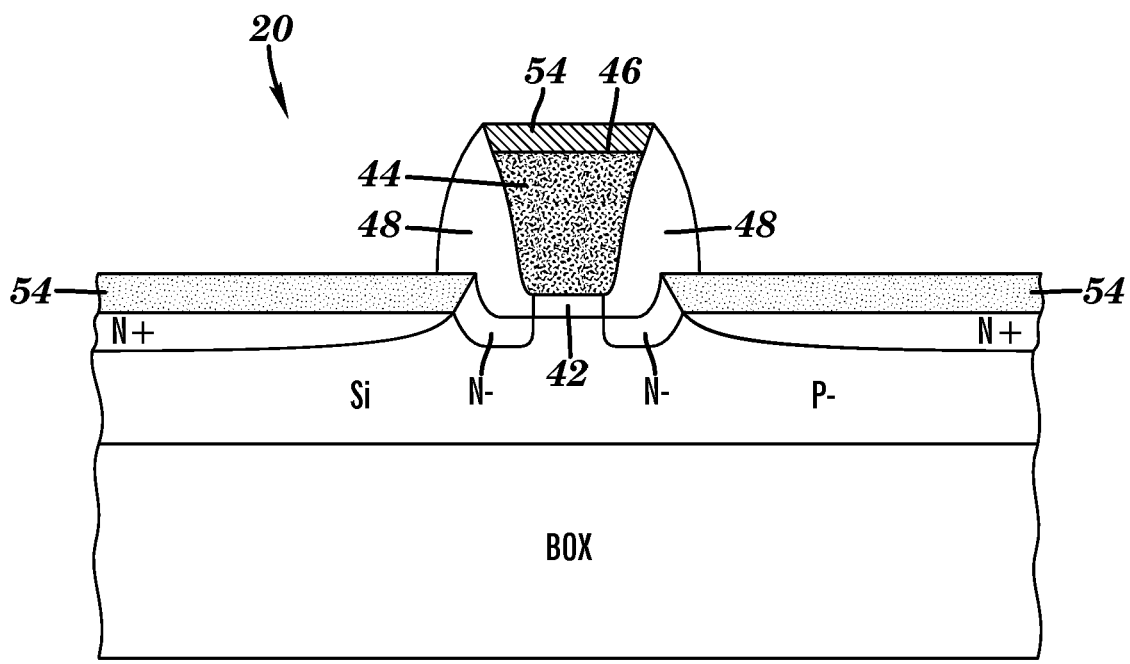
FIG. 10 is a side-sectional schematic view of an nFET device according to the prior art. STI regions are not shown. Also not shown in FIG. 10 are various known stress liners as discussed, for example, in the '866, '808 and '584 U.S. patents previously mentioned.

The nFET is then silicided in any conventional fashion, so that silicides 7 are formed at locations as shown in FIG. 1, to form the nFET device of FIG. 1. More details for various parts of the structure of FIG. 1 are shown, for example, in the prior art nFET device structure shown in FIG. 10 and described in U.S. Pat. No. 6,930,030 B2 previously incorporated herein by reference.

The foregoing description for FIG. 1 is with respect to nFET devices. Of course, it is understood by those skilled in the art in view of the instant disclosure that the polarity type of dopants is reversed when pFET devices are used, and that conventional masking, patterning etc. are required during processing.

Figure 2:
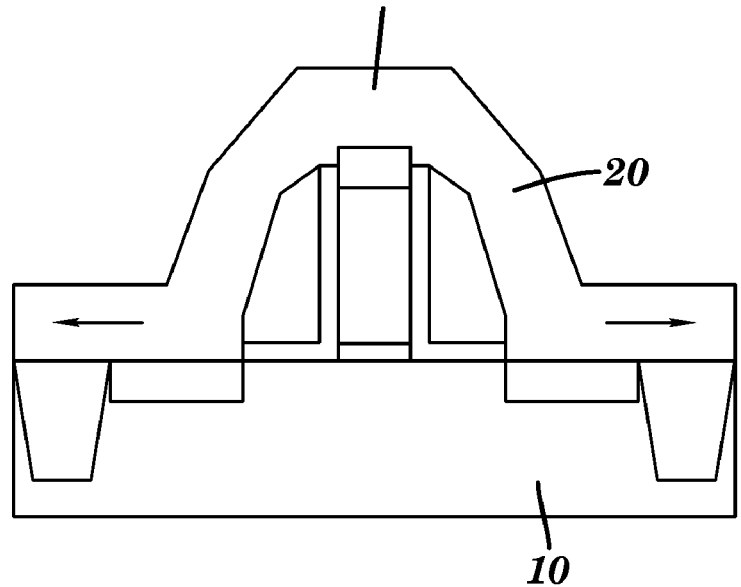

Next, referring to FIG. 2, a first conformal dielectric stress layer or film 20 is deposited over the device formed on the substrate 10. More specifically, deposit the layer 20 over the silicided gate with spacers SP, silicided source and drain regions, and the isolation regions STI. The layer 20 is preferably silicon nitride ($Si_3N_4$) and is deposited to one approximately (±10%) uniform thickness selected from a range of thicknesses from about 20 nanometers to about 70 nanometers. For example, the $Si_3N_4$ can be deposited by conventional chemical vapor deposition (CVD), HDP, ALD or other conventional deposition techniques. The $Si_3N_4$ has a high tensile stress such as a stress in a range from about 1 GPa to about 3 GPa.

Figure 3:
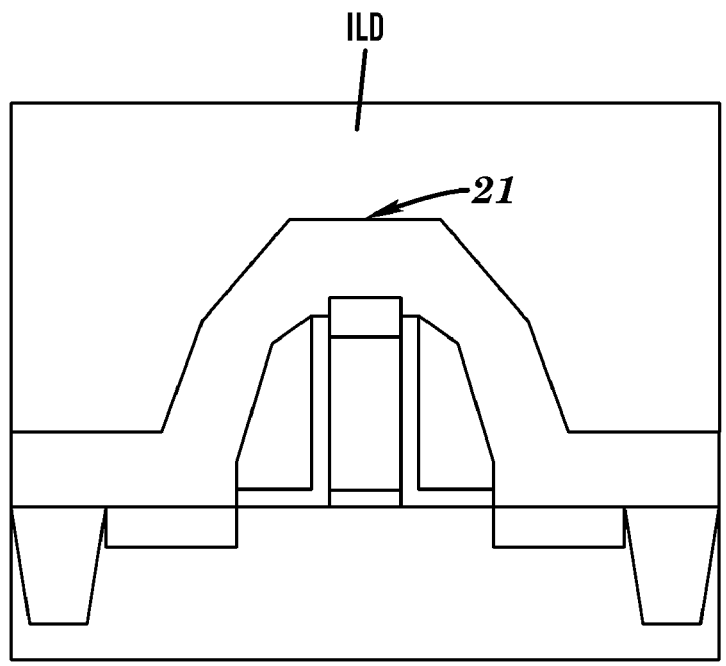

Next, referring to FIG. 3, cover the stress layer 20 disposed over the silicided gate G1 with spacers SP, the silicided source and drain regions S,D and the STI regions. Covering is accomplished, for example, by means of depositing an insulating layer ILD. Preferably, the layer ILD is any suitable oxide such as silicon oxide and deposited by any suitable conventional techniques such as CVD. Preferably, the insulating layer ILD has a thickness (above a top surface 21 of the layer 20), which thickness is approximately twice the thickness of the layer 20.

Figure 4:
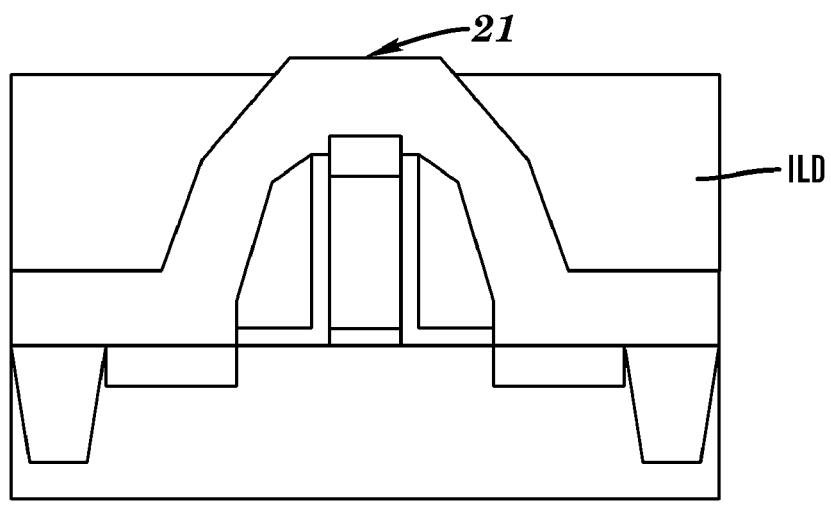

Then, remove the layer ILD to an extent such that the top surface 21 of the stress layer 20 is exposed. The resulting structure is shown in FIG. 4. Removal is accomplished, for example, by means of a conventional reactive ion etching (RIE) or CMP or other conventional technique.

Figure 5:
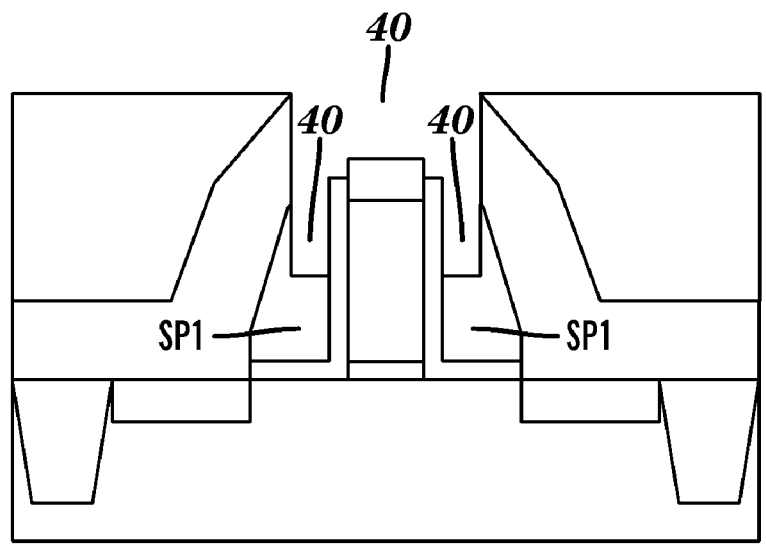

After removing the layer ILD, remove portions of the layer 20 and the spacers SP selectively to oxide as shown in FIG. 5, to form spacers SP1 and a trench 40. Removal is accomplished by means of any suitable and conventional etching such as RIE. The trench 40 surrounds portions of the gate stack provided with oxide layers 5 as shown in FIG. 5. Preferably, the trench 40 extends approximately half-way along the height of the gate stack G1, 7,3. The trench 40 can have, for example, a rectangular area in a space between each spacer SP1 and the oxide layer 5.

Figure 6:
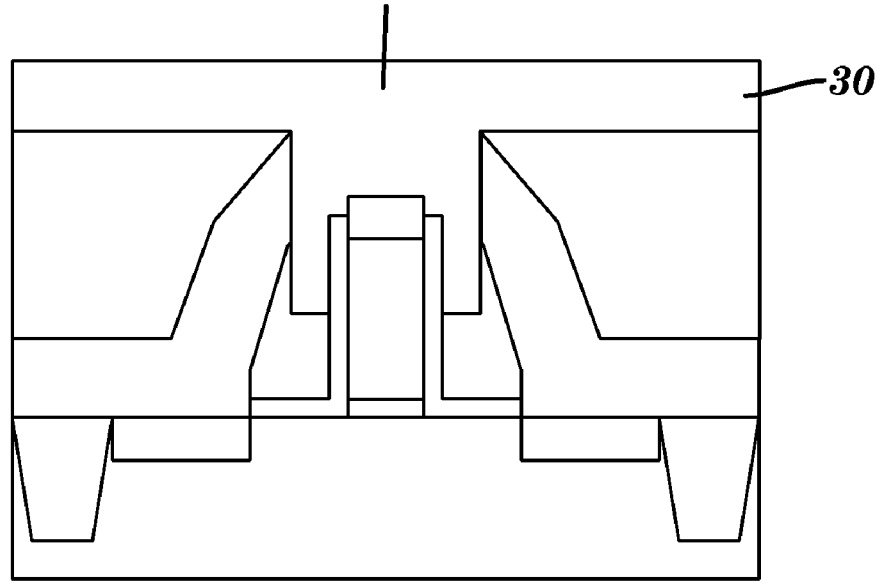

After forming the trench 40, deposit a compressive stress material in the trench, by means of any conventional technique such as CVD, to result in the structure of FIG. 6. For compositions of various stress films or layers, and deposition techniques, see, for example: "A Highly Dense, High-Performance 130 nm node CMOS Technology for Large Scale System-on-a-Chip Applications", by F. Ootsuka et al., IEDM, 2000, pages 23.5.1-23.5.4 which is incorporated herein.

Figure 7:
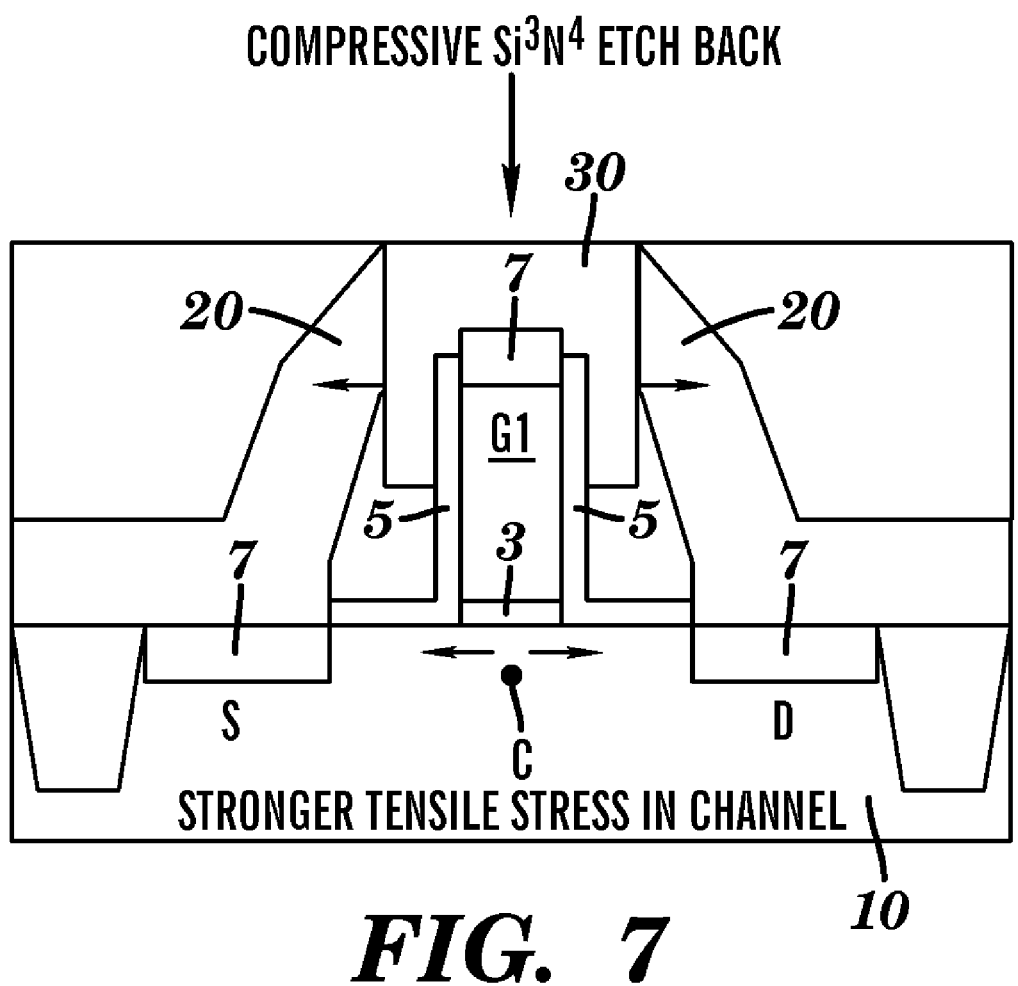

Then, remove the material 30 located outside of the trench 40, to form the device structure shown in FIG. 7. Removal is accomplished by any suitable etching such as RIE or CMP.

Figure 8:
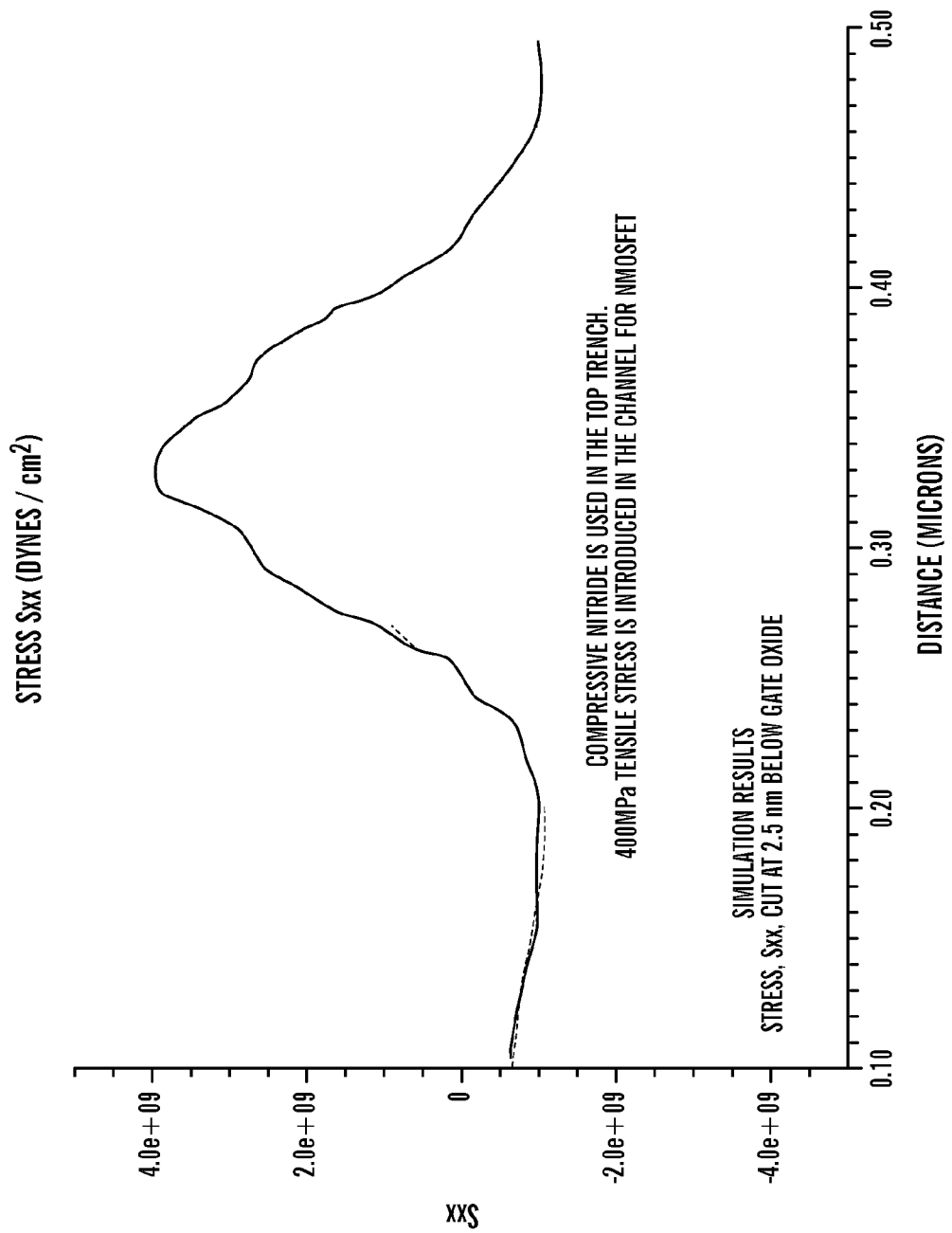
FIG. 8 is a diagram with explanatory legends showing a simulation for a resulting stress in the channel of the nFET device verses the stresses contributed by tensile stress layer 20 and the compressive material 30, for 90 nm process technology; the layer 20 has a tensile stress of approximately (±10) 1 GPa to approximately 3 GPa, and the material 30 has a compressive stress of approximately 1 GPa to approximately 4 GPa.

The diagram of FIG. 8, shows a simulation of the relationship between stress (Y-axis) and location (X-axis) in the channel C, for an nFET semiconductor device structure according to the present invention. A center of the channel C is located at a distance of approximately 0.35 microns across width of the channel C.

Figure 9:
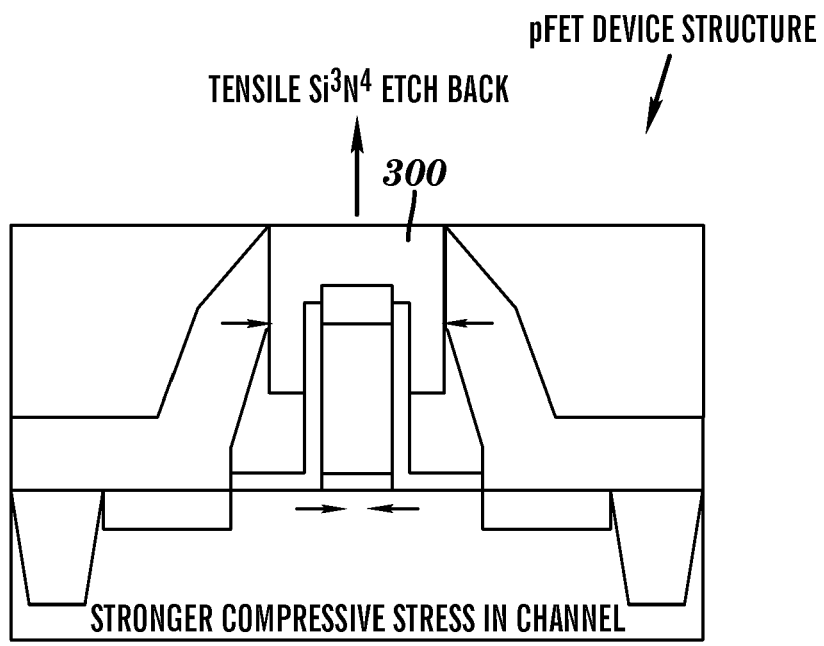
FIG. 9 is a side-sectional schematic view of a pFET semiconductor device structure according to the present invention.

As previously mentioned, Applicant's invention includes a method for making a semiconductor device structure including an nFET device and a pFET device. See FIG. 9. In FIG. 9, a tensile stress material 300 fills a trench into which a gate stack provided with sidewall (e.g., oxide) layers extends. The gate stack includes a gate electrode, an oxide layer disposed below the gate, and a silicide disposed above the gate, all as shown in FIG. 9.

While the invention has been particularly shown and described with reference to the preferred embodiments thereof, it will be understood by those skilled in the art that various changes in form and details may be made without departing from the spirit and scope of the invention.

What is claimed is:

1. A method for making a semiconductor device structure, comprising:
    forming on a substrate: a first layer below and second layers on a gate with spacers, source and drain regions adjacent to the gate, silicides on the gate and source and drain regions, and a sidewall oxide layer between the spacers and the gate;
    disposing a stress layer over the structure resulting from said forming step;
    disposing an insulating layer over the stress layer;
    removing portions of the insulating layer to expose a top surface of the stress layer;
    removing the top surface and other portions of the stress layer and portions of the spacers, and not said sidewall oxide layer to form a trench, the trench extending along a height of the silicide on the gate and partly along a height of the gate; and then
    disposing a stress material into the trench.

2. The method as claimed in claim 1, said step of removing the top surface comprising forming the trench at locations above the silicide on the gate and above and around portions of the second layers.

3. The method as claimed in claim 1, further comprising removing the stress material such that the stress material remains only in the trench.

4. The method as claimed in claim 1, wherein the stress layer is a layer selected from the group consisting essentially of silicon nitride, silicon oxide and silicide layers.

5. The method as claimed in claim 1, wherein the insulating layer is an oxide layer.

6. The method as claimed in claim 1, wherein said step of removing portions of the insulating layer comprises chemically mechanically polishing the insulating layer.

7. The method as claimed in claim 1, wherein said step of removing portions of the insulating layer comprises reactive ion etching the insulating layer.

8. The method as claimed in claim 1, wherein said step of removing the top surface comprises etching the top surface selectively to the second layers.

9. The method as claimed in claim 1, wherein the first layer and the second layers are oxides.

10. The method as claimed in claim 1, said step of disposing a stress material into the trench comprising disposing a compressive stress material into the trench.

11. The method as claimed in claim 1, said step of disposing a stress material into the trench comprising disposing a tensile stress material into the trench.

12. The method as claimed in claim 1, said step of removing the top surface comprising removing the top surface and other portions of the stress layer and portions of the spacers to form a trench which surrounds portions of the second layers and portions of the silicide on the gate.

13. The method as claimed in claim 1, wherein the stress layer has a thickness of about 20 nanometers to about 80 nanometers.

14. A method for making a semiconductor device structure, comprising:

forming on a substrate: a first layer below and second layers on a gate with spacers, source and drain regions adjacent to the gate, silicides on the gate and source and drain regions;

disposing a stress layer over the structure resulting from said forming step;

disposing an insulating layer over the stress layer;

removing portions of the insulating layer to expose a top surface of the stress layer;

removing the top surface and other portions of the stress layer and portions of the spacers to form a trench, the trench extending along a height of the silicide on the gate and partly along a height of the gate; and then disposing a stress material into the trench, wherein said stress layer has one of a tensile stress or a compressive stress, and said stress material has the other of said tensile stress or compressive stress not present in the stress layer.

* * * * *

UNITED STATES PATENT AND TRADEMARK OFFICE
CERTIFICATE OF CORRECTION

| | | |
|---|---|---|
| PATENT NO. | : 7,635,620 B2 | Page 1 of 1 |
| APPLICATION NO. | : 11/306745 | |
| DATED | : December 22, 2009 | |
| INVENTOR(S) | : Chen et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 668 days.

Signed and Sealed this

Ninth Day of November, 2010

David J. Kappos
*Director of the United States Patent and Trademark Office*